(12) United States Patent
Chang

(10) Patent No.: US 7,696,079 B2
(45) Date of Patent: Apr. 13, 2010

(54) METHODS FOR PATTERNING FILMS, FABRICATING ORGANIC ELECTROLUMINESCENCE DISPLAY AND FABRICATING THIN FILM TRANSISTOR ARRAY SUBSTRATE

(75) Inventor: Hsi-Ming Chang, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 396 days.

(21) Appl. No.: 11/162,867

(22) Filed: Sep. 27, 2005

(65) Prior Publication Data

US 2007/0072322 A1    Mar. 29, 2007

(51) Int. Cl.
*H01L 21/44* (2006.01)
(52) U.S. Cl. ............ 438/609; 438/30; 438/99; 438/151; 438/669; 438/701; 257/E21.235
(58) Field of Classification Search ............ 438/29, 438/152, 609, 640, 669, 672, 674–675, 30, 438/99, 151, 707; 257/E21.235
See application file for complete search history.

(56) References Cited

U.S. PATENT DOCUMENTS 6,812,142 B1 * 11/2004 Nguyen et al. ............ 438/640
6,972,819 B2 * 12/2005 Lee et al. .................. 349/149
7,102,168 B2 *  9/2006 Rhee et al. ................. 257/72
2006/0049753 A1 *  3/2006 Kang et al. ................ 313/506
2006/0186409 A1 *  8/2006 Horino et al. ............... 257/59

FOREIGN PATENT DOCUMENTS

| JP | 2002-098996 | 4/2002 |
| JP | 2002-250934 | 9/2002 |
| JP | 2002-250935 | 9/2002 |
| JP | 2002-341382 | 11/2002 |
| JP | 2002-350897 | 12/2002 |

* cited by examiner

*Primary Examiner*—M. Wilczewski
*Assistant Examiner*—Toniae M Thomas
(74) *Attorney, Agent, or Firm*—Jianq Chyun IP Office

(57) ABSTRACT

A method for fabricating a thin film transistor array substrate is provided. Wherein, a plurality of contact holes and recesses are formed in a protection layer disposed upon thin film transistors. Each recess comprises an under-cut profile while each contact hole exposes a drain-metal layer of a corresponding thin film transistor. Then, a transparent conductor layer is formed on the protection layer, which in turn fills in the contact holes so as to be electrically connected to the drain-metal layer. Besides, the transparent conductor layer automatically segregates at the recesses to form a plurality of pixel electrodes, whereby the plurality of pixel electrodes can be formed without the utilization of photolithography and etching processes and thus fabricating cost is lowered.

14 Claims, 11 Drawing Sheets

METHODS FOR PATTERNING FILMS, FABRICATING ORGANIC ELECTROLUMINESCENCE DISPLAY AND FABRICATING THIN FILM TRANSISTOR ARRAY SUBSTRATE

BACKGROUND OF THE INVENTION

1. Field of the Invention

The present invention generally relates to a method for fabricating an active driven display, and more particularly, to a method for fabricating an active organic electroluminescence display and a thin film transistor array substrate.

2. Description of Related Art

As the high technology continues to evolve, digitalized image devices have become popular products in every day life. Among these digitalized image devices, the most appealing products are liquid crystal displays (LCDs) implementing thin film transistors as driven elements and organic electroluminescence displays (OELDs), wherein these thin film transistors are formed on a thin film transistor array substrate.

FIGS. 1A-1E are cross-sectional views of the processing flow for fabricating a conventional thin film transistor array substrate. Referring to FIG. 1A, a plurality of thin film transistors 110, as well as scan lines (not shown) and data lines (not shown) electrically connected thereto are formed on a substrate 100. Then, a protection layer 102 is formed on the substrate 100 to cover the thin film transistors 110, as well as the scan lines and data lines. Subsequently, referring to FIG. 1B, a plurality of contact holes 104 are formed in the protection layer 102 by using photolithography and etching processes, and then expose a drain-metal layer 112 of the thin film transistors 110. Afterwards, referring to FIG. 1C, a transparent conductor layer 106 is formed on the protection layer 102, which in turn fills in the contact holes so as to be electrically connected to the drain-metal layer 112. Referring to FIG. 1D, a positive type photoresist layer 108 is formed on the transparent conductor layer 106, which is then subjected to the photolithography and etching processes with a mask 120 so as to pattern the transparent conductor layer 106. Referring to FIG. 1E, a plurality of pixel electrodes 130 is formed on the substrate 100 after the positive type photoresist layer 108 is removed.

To a general LCD, the thin film transistor substrate is mostly accomplished when a structure as shown in FIG. 1E is obtained. One of ordinary skill in the art should realize that the aforementioned processing flow for fabricating the thin film transistor substrate at least needs 5 masks. However, in addition to the preceding 5 masks, the processing flow for fabricating an active organic electroluminescence display further requires an extra mask for forming a pixel define layer (PDL) 140, as shown in FIG. 1F, so as to define dispositions for a subsequently deposited organic electroluminescence layer 150. In other words, the processing flow for fabricating the active organic electroluminescence display at least needs 6 masks, which makes this processing flow complicated and accordingly increases fabricating cost.

SUMMARY OF THE INVENTION

Accordingly, the present invention is directed to a method for patterning films, which is capable of saving a step of photolithography process and accordingly lowers fabricating cost.

Accordingly, the present invention is directed to a method for fabricating a thin film transistor array substrate, which is capable of saving a step of photolithography process and accordingly lowers fabricating cost.

Accordingly, the present invention is directed to a method for fabricating an active organic electroluminescence display, which is capable of saving a step of photolithography process and accordingly lowers fabricating cost.

The present invention provides a method for patterning films, in which a first film is first formed on a substrate. Afterwards, in the first film a plurality of recesses with an under-cut profile and openings are formed. Subsequently, a second film is formed on the first film, which in turn fills these openings and automatically segregates at these recesses to form a plurality of patterns on the first film.

According to a preferred embodiment of the present invention, a method for forming the aforementioned openings and recesses may be, for example, first forming a photoresist layer on the first film, followed by patterning the photoresist layer through a photolithography process with a mask and finally partially exposing the first film for forming the predetermined preceding recesses. Wherein, this mask comprises an opaque area, a transparent area and a semitransparent area which corresponds to the location for forming the predetermined preceding openings. Subsequently, the preceding recesses and openings are formed after the partially exposed first film and the partial photoresist layer and partial first film that correspond to the semitransparent area are removed. Eventually, the photoresist layer is removed.

According to a preferred embodiment of the present invention, the partial first film for forming the predetermined preceding recesses, and the partial photoresist layer that corresponds to the semitransparent area are, for example, removed by using a same etching process.

According to a preferred embodiment of the present invention, a method for forming the recesses by partially removing the first film comprises a wet etching or a dry etching.

The present invention provides a method for fabricating a thin film transistor array substrate, in which a protection layer and a plurality of thin film transistors are formed on a substrate. Wherein, the protection layer covers the thin film transistors, each of which comprises a source-metal layer and a drain-metal layer. Afterwards, a plurality of recesses and contact holes are formed in the protection layer. Besides, each recess comprises an under-cut profile and each contact hole exposes the drain-metal layer of its corresponding thin film transistor. Subsequently, a transparent conductor layer is formed on the protection layer, which in turn fills these contact holes so as to be electrically connected to the drain-metal layer. Besides, the transparent conductor layer automatically segregates at these recesses to form a plurality of pixel electrodes.

The present invention provides a method for fabricating an organic electroluminescence display, in which a protection layer and a plurality of thin film transistors are formed on a substrate. Wherein, the protection layer covers the thin film transistors, each of which comprises a source-metal layer and a drain-metal layer. Afterwards, a plurality of recesses and contact holes is formed in the protection layer. Besides, each recess comprises an under-cut profile and each contact hole exposes the drain-metal layer of its corresponding thin film transistor. Subsequently, a transparent conductor layer is formed on the protection layer, which in turn fills these contact holes so as to be electrically connected to the drain-metal layer. Besides, the transparent conductor layer automatically segregates at these recesses to form a plurality of pixel electrodes. A pixel isolating layer is then formed on the substrate and partially exposes each pixel electrode. After that, on the exposed pixel electrode an organic electroluminescence layer is formed. A cathode layer is grossly formed on the substrate so as to cover the organic electroluminescence layer.

According to a preferred embodiment of the present invention, a method for forming the aforementioned recesses and contact holes may be, for example, first forming a photoresist layer on the protection layer, followed by patterning the photoresist layer through a photolithography process with a mask and finally partially exposing the protection layer where is predetermined to form the preceding recesses. Wherein, this mask comprises an opaque area, a transparent area and a semitransparent area that corresponds to the location where is predetermined to form the preceding openings. Subsequently, the photoresist layer is removed.

According to a preferred embodiment of the present invention, the partial protection layer for forming the predetermined preceding recesses, and the partial photoresist layer that corresponds to the semitransparent area are, for example, removed by using a same etching process.

According to a preferred embodiment of the present invention, the partial photoresist layer corresponding to a semitransparent area is, for example, removed by using an ashing method.

According to a preferred embodiment of the present invention, a method for forming the recesses by partially removing the dielectric layer comprises a wet etching or a dry etching.

The present invention utilizes a mask with a semitransparent area to proceed with a process of exposure during a photolithography process for forming conventional openings, so as to form the recesses with under-cut profiles and openings at the same time. As such, when the second film is formed on the first film with the openings, the second film automatically segregates at the recesses so as to form a plurality patterns on the first film. In other words, compared with prior art, the present invention is capable of saving a mask for patterning the second film, which in turn saves fabricating time and cost.

The objectives, other features and advantages of the invention will become more apparent and easily understood from the following detailed description of the invention when taken in conjunction with the accompanying drawings.

DESCRIPTION OF THE EMBODIMENTS

Figure 1A:
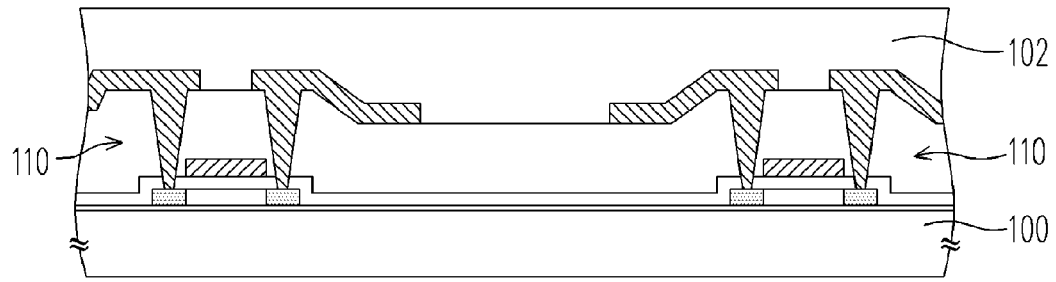
FIGS. 1A-1F are cross-sectional views of the processing flow for fabricating a conventional thin film transistor array substrate.
Figure 1B:
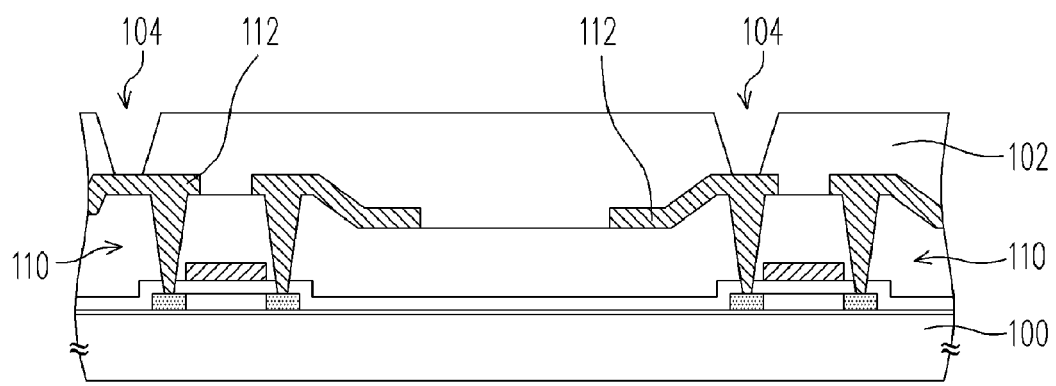
Figure 1C:
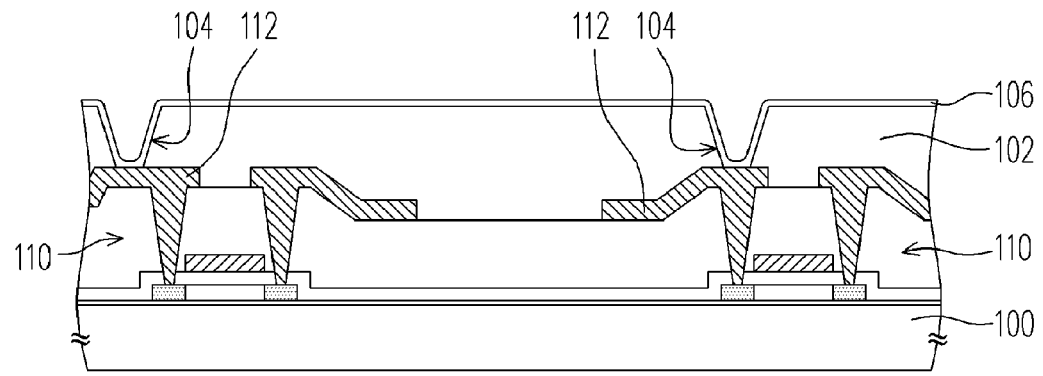
Figure 1D:
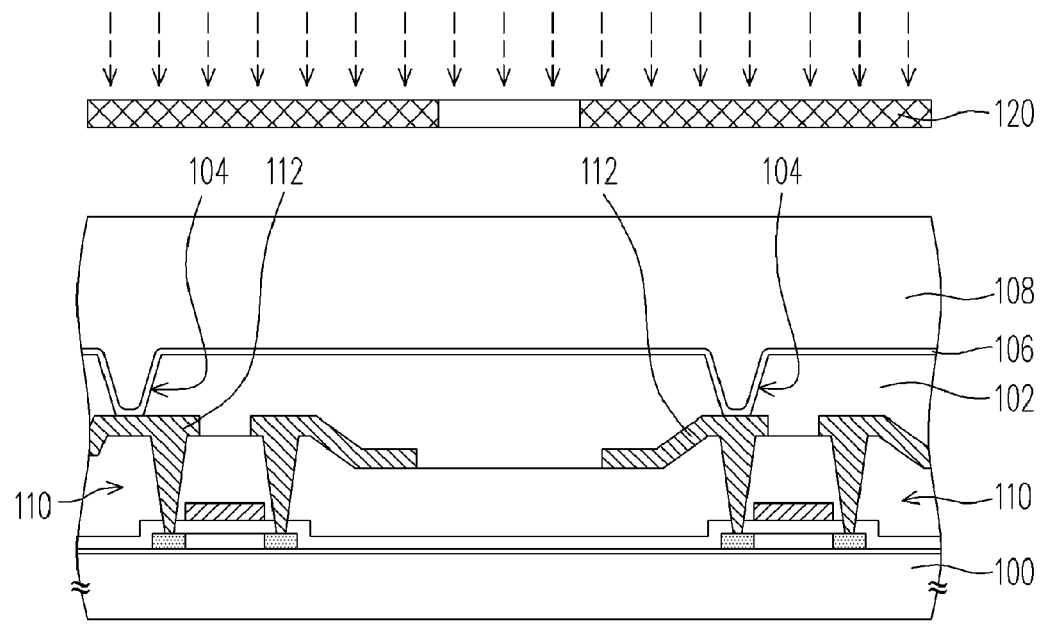
Figure 1E:
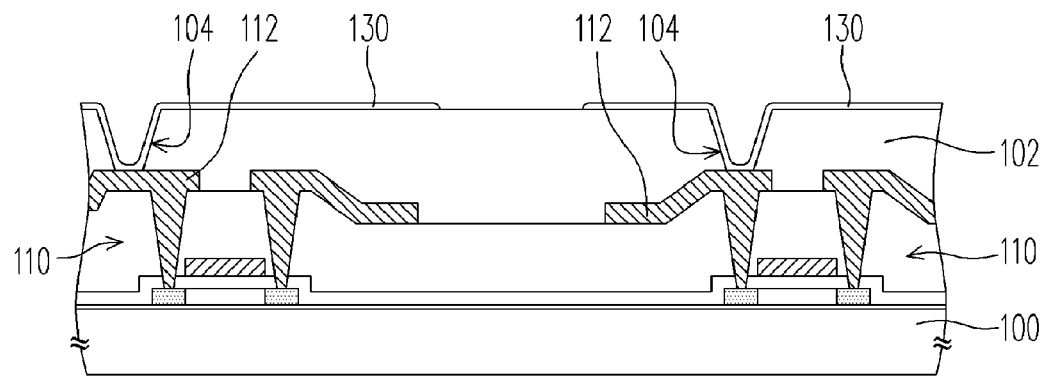
Figure 1F:
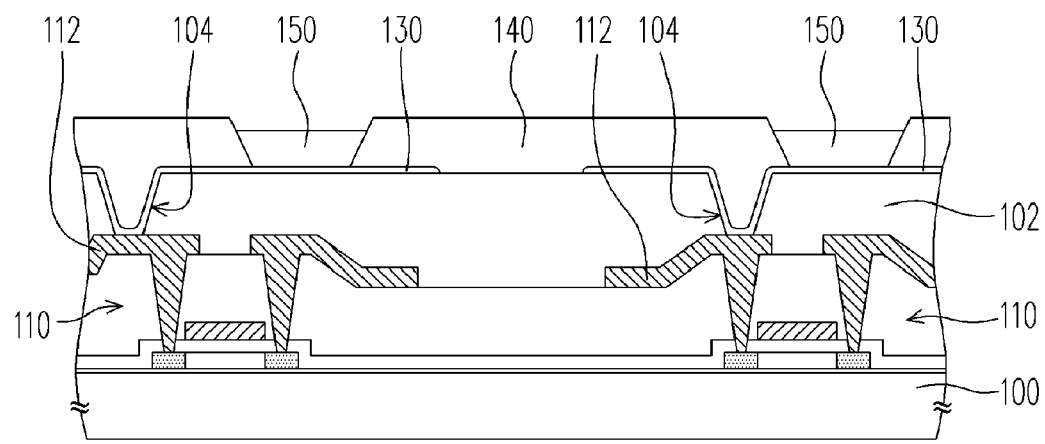

Reference will now be made in detail to the present invention, examples of which are illustrated in the accompanying drawings. Wherever possible, the same reference numbers are used in the drawings to be referred to the same parts.

The present invention employs a same mask to form the recesses with under-cut profiles and openings in the first film so as to help the second film automatically segregate at the recesses when the second film is formed on the first film, thereby forming the plurality of patterns on the first film. That is, the present invention is able to accomplish the process for patterning the second film without conducting the photolithography and etching process thereof, thereby considerably saving fabricating cost and time. The following embodiments take the processing flow for fabricating the thin film transistor array substrate and the active organic electroluminescence display as examples, which are not intended to limit the present invention. One of ordinary skill in the art should realize that the present invention is applicable to pattern any film layers.

Figure 2A:
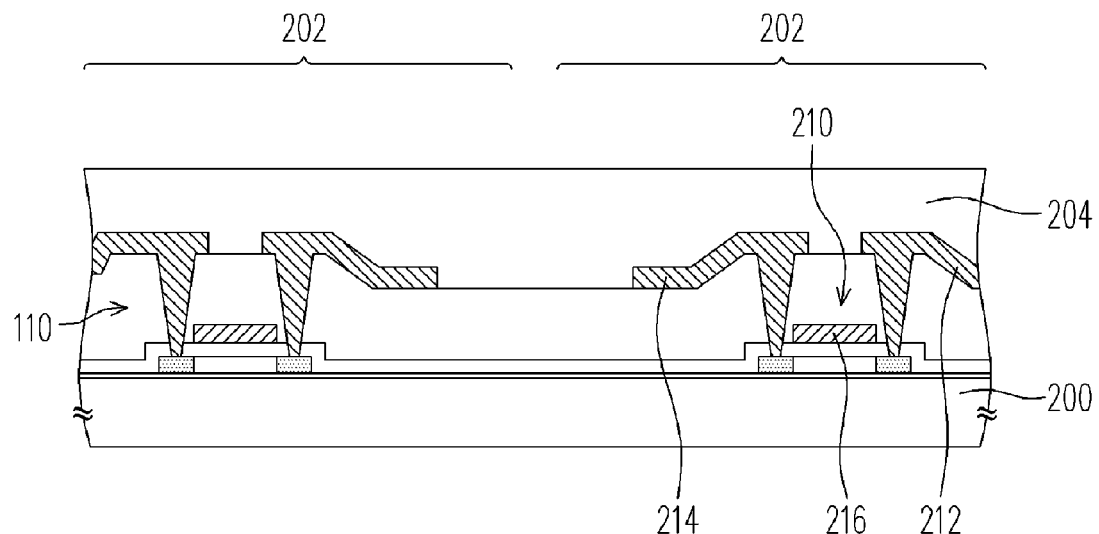
FIGS. 2A-2C show cross-sectional views of the processing flow for fabricating a thin film transistor array substrate of a preferred embodiment of the present invention.
Figure 2B:
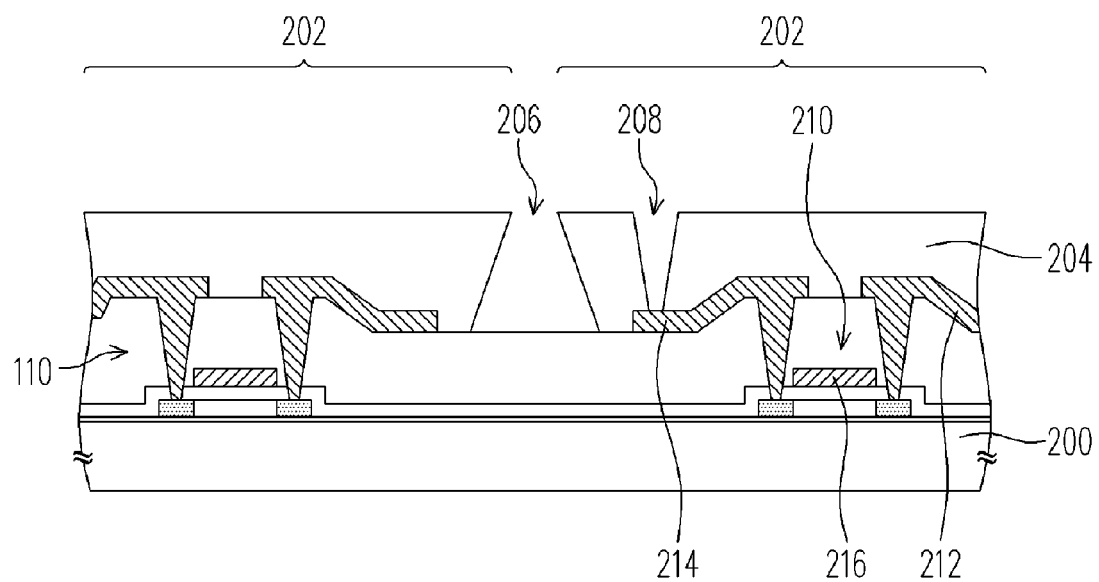
Figure 2C:
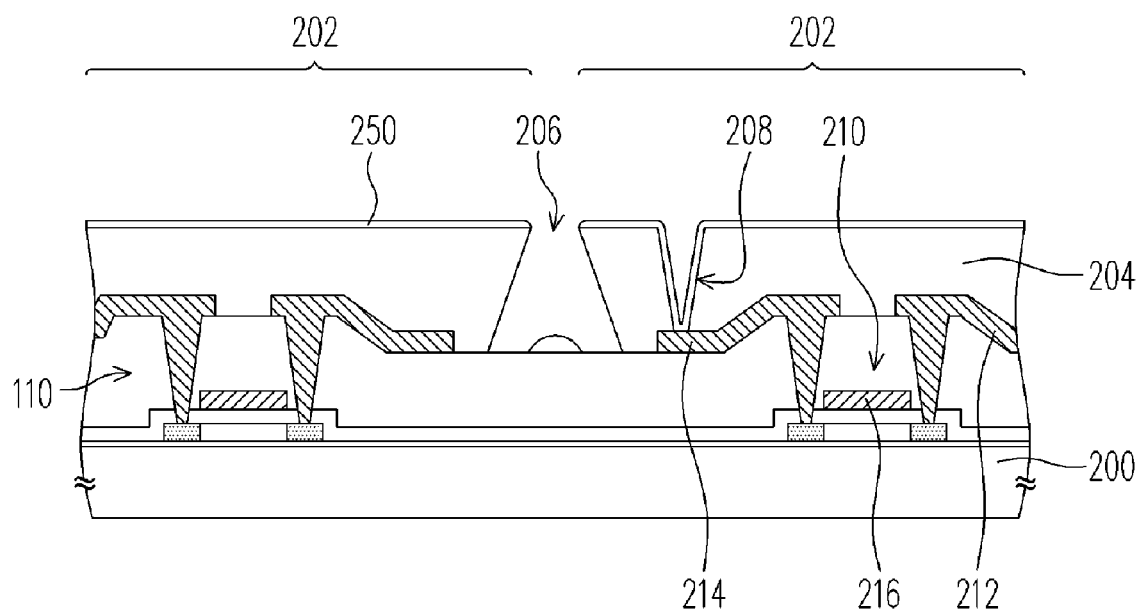

FIGS. 2A-2C show cross-sectional views of the processing flow for fabricating a thin film transistor array substrate of a preferred embodiment of the present invention. Referring to FIG. 2A, a substrate 200 is provided, on which a plurality of pixel areas 202 has been defined. On the substrate 200, a plurality of thin film transistors 210 is formed, which are then covered by a protection layer 204. Wherein, each thin film transistor 210 comprises a source-metal layer 212 and a drain-metal layer 214.

One of ordinary skill in the art should realize that during the process for forming the gate 216 of the thin film transistor 210, a plurality of scan lines (not shown), electrically connected to the gate 216, are simultaneously formed on the substrate 200. On the other hand, during the process for forming the source-metal layer 212 and the drain-metal layer 214, a plurality of data lines (not shown), electrically connected to the drain-metal layer 214, are simultaneously formed on the substrate 200. Besides, the pixel areas 202 are separated each other through these scan lines and data lines.

Referring to FIG. 2B, a plurality of recesses 206 and contact holes 208 are formed in the protection layer 204. Wherein, these recesses 206 with under-cut profiles are correspondingly disposed, for example, over the preceding scan lines and data lines, and the contact holes 208 expose the drain-metal layer 214 of the thin film transistor 210.

Figure 3A:
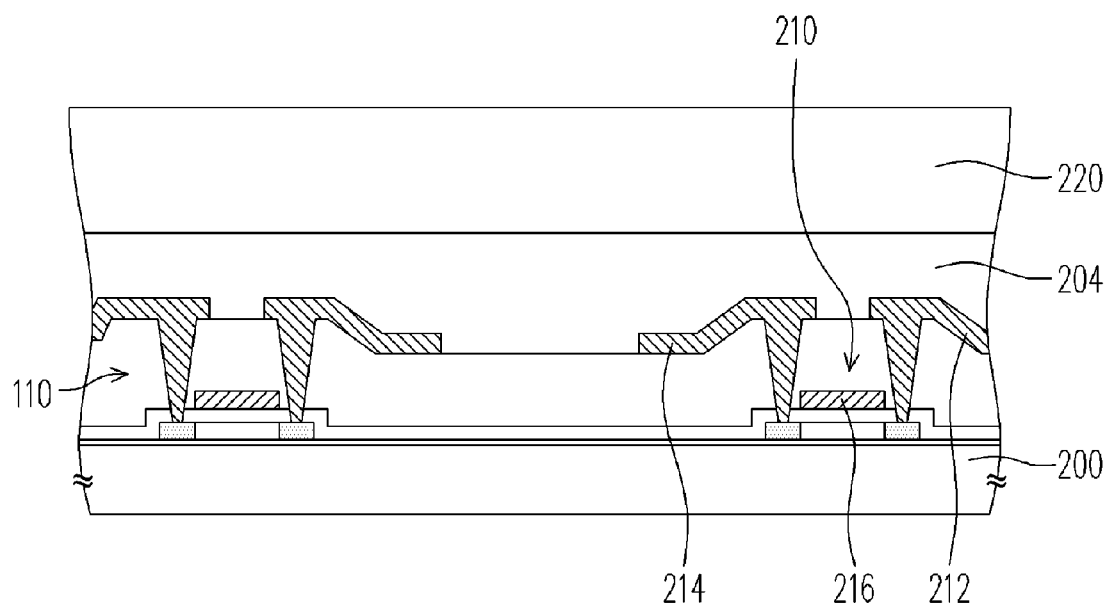
FIGS. 3A-3E show cross-sectional views of the processing flow for fabricating recesses and contact holes as shown in FIG. 2B.
Figure 3B:
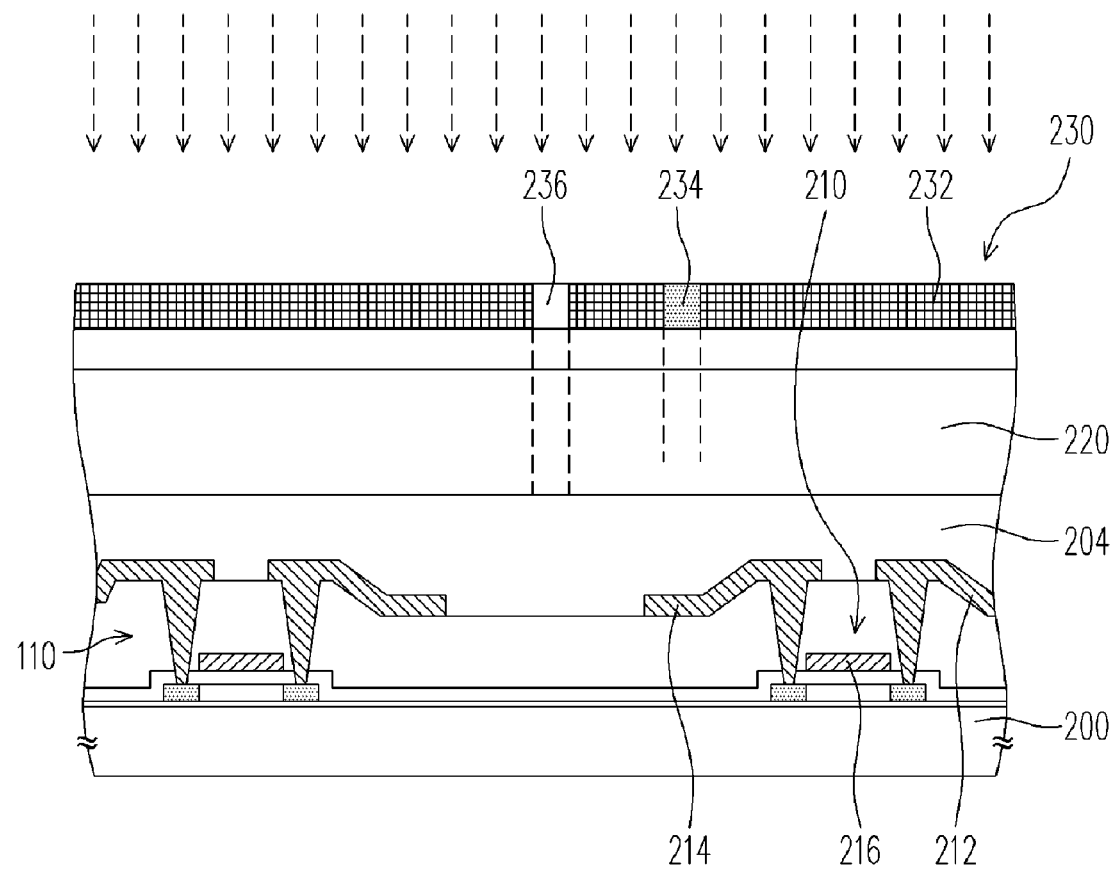

The method for forming the recesses 206 and contact holes 208 may be, for example, the processing flow as shown in FIG. 3A to FIG. 3E. Referring to FIG. 3A, a photoresist layer 220 is first formed on the protection layer 204, followed by conducting a process of exposure for the photoresist layer 220 with a mask 230, as shown in FIG. 3B. Wherein, the mask 230 comprises an opaque area 232, a semitransparent area 234 and a transparent area 236.

Figure 3C:
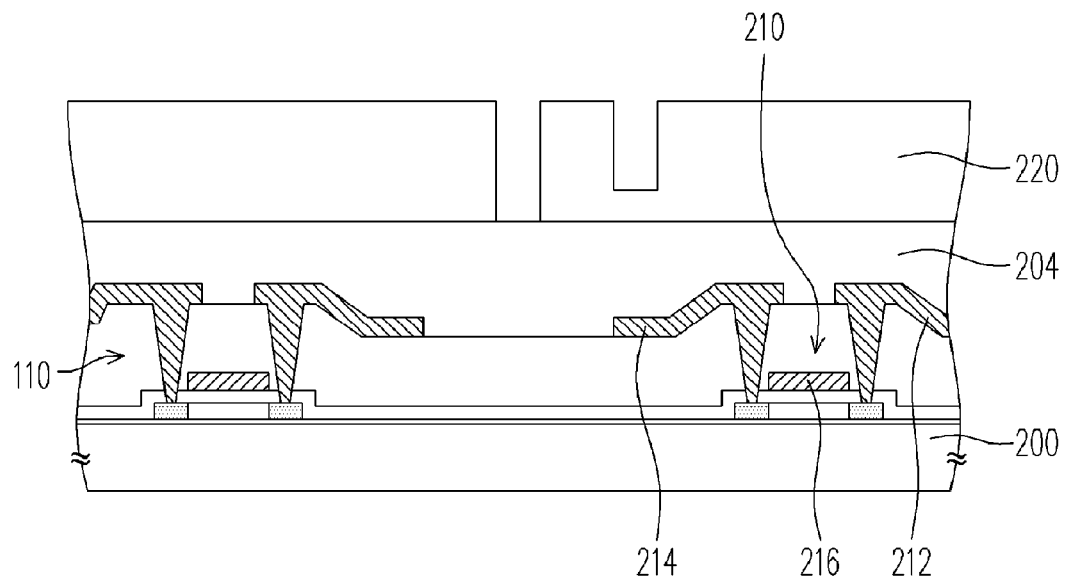

The photoresist layer 220 of this embodiment is, for example, a positive photoresist. Referring to FIG. 3B, it is noted that the photoresist layer 220 that corresponds to the semitransparent area 234 is subjected to less light irradiating intensity during the exposure process when compared with that of the photoresist layer 220 that corresponds to the transparent area 236. As such, as shown in FIG. 3C, after the development process is completed, the photoresist layer 220 that corresponds to the transparent area 236 is totally removed; whereas, the photoresist layer 220 that corresponds to the semitransparent area 234 is not totally removed.

Figure 3D:
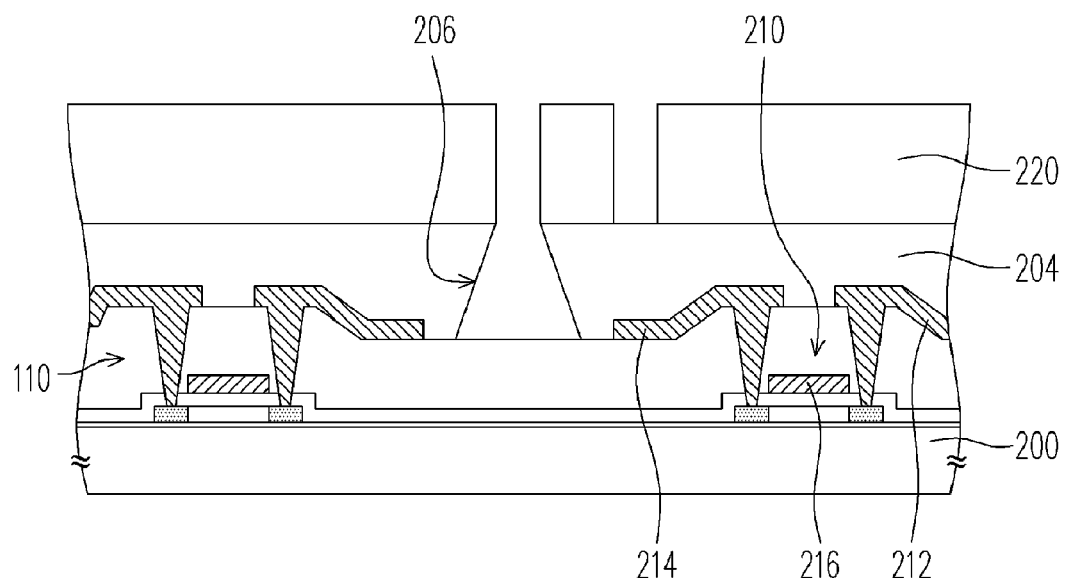

Referring to FIG. 3D, the protection layer 204 is subjected to an etching process using the developed photoresist layer 230 as a mask so as to partially remove the protection layer 204 exposed by the developed photoresist layer 230 to form a recess 206 with an under-cut profile. Wherein, the recess 206 is formed, for example, by using a wet etching or a dry etching. It is noted that the photoresist layer 220 that corresponds to the semitransparent area 234, as shown in FIG. 3B, is simultaneously removed during the preceding etching process. Of course, other etching processes can also be implemented for partially removing the photoresist layer 220 in other embodiments. For example, the photoresist layer 220 can be partially removed by using an ashing method.

Figure 3E:
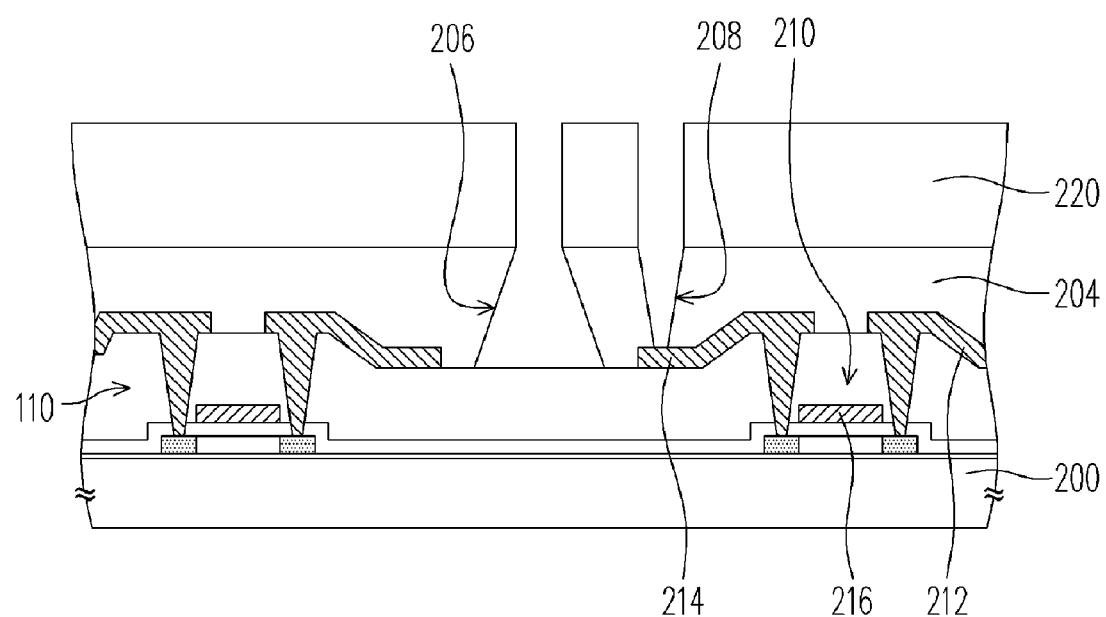

Referring to FIG. 3E, after removing the photoresist layer 220 that corresponds to the semitransparent area 234, as shown in FIG. 3B, the etching process is again conducted for the protection layer 204 using the developed photoresist layer 230 as a mask so as to partially remove the protection layer 204 exposed by the developed photoresist layer 230 to form a plurality of contact holes 208 which then expose the drain-metal layer 214 of each thin film transistor 210. Afterwards, a structure as shown in FIG. 2B is accomplished after removing the photoresist layer 220.

Referring to FIG. 2C, a transparent conductive layer is formed on the protection layer 204 so that the transparent conductive layer fills the contact holes 208 formed in the protection layer 204 and electrically connected to the drain-metal layer 214 of the thin film transistor 210. Particularly, the transparent conductive layer automatically segregates at the recess 206, thereby forming a pixel electrode 250 inside each pixel area 202.

Figure 4:
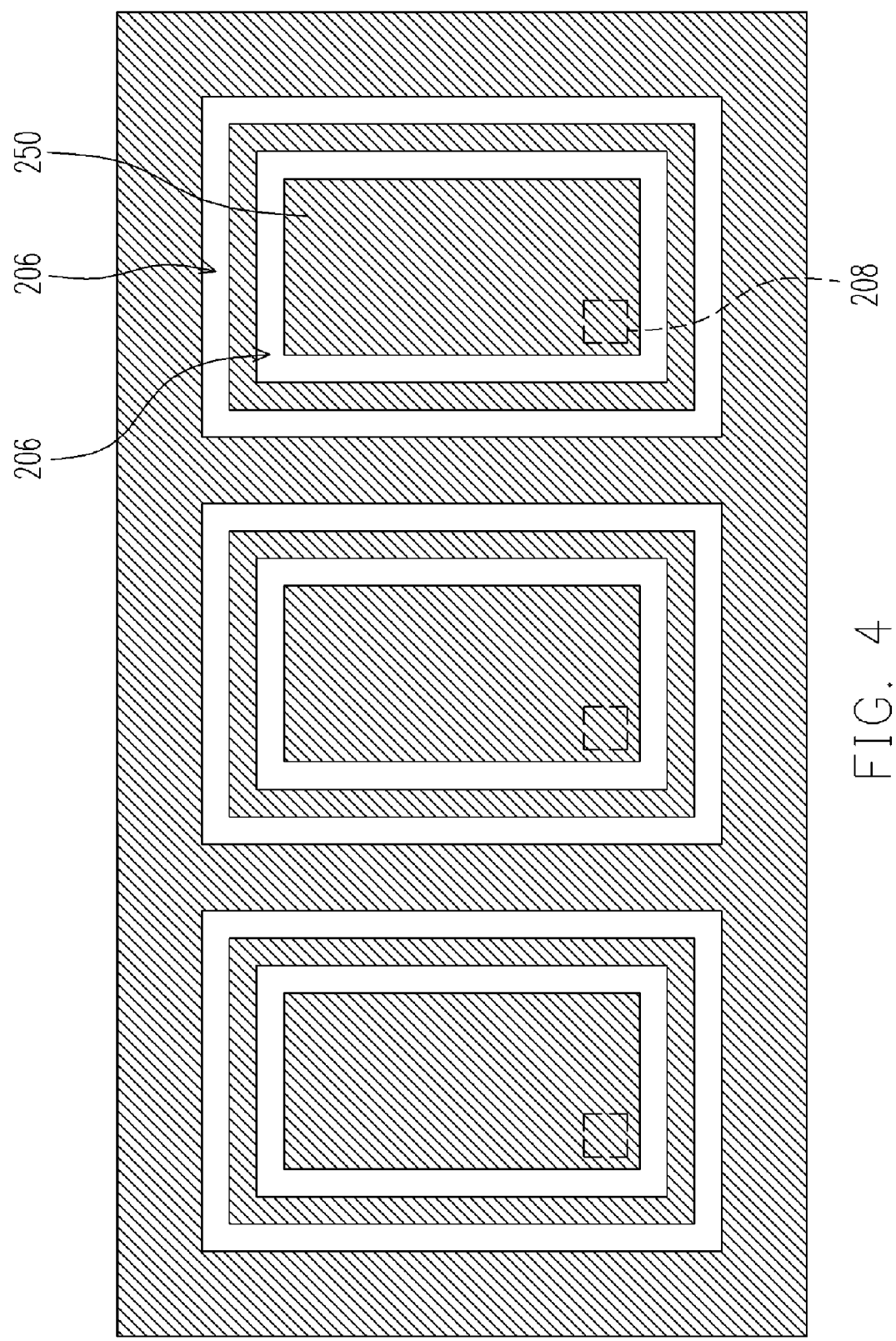
FIG. 4 shows a partial top view of a thin film transistor array substrate of a preferred embodiment of the present invention.

It is noted that although in the drawings, only one recess 206 is disposed between two neighboring pixel areas 202, actually, in the present invention, the number of the recesses disposed between two neighboring pixel areas 202 is not limited. As shown in FIG. 4, a plurality of recesses 206 is disposed between two neighboring pixel areas 202. Additionally, although the recess 206 is used to automatically pattern the pixel electrode 250 in this embodiment, in other embodiments, the present invention can be applied to pattern the source-metal layer 212 and the drain-metal layer 214 or the gate 216. One of ordinary skill in the art can apply the present invention to any film layers depending upon the practical needs.

The thin film transistor substrate is mostly accomplished after the formation of the pixel electrode 250. The rest processes are substantially identical to those of a general thin film transistor substrate and thus omitted here.

Figure 5A:
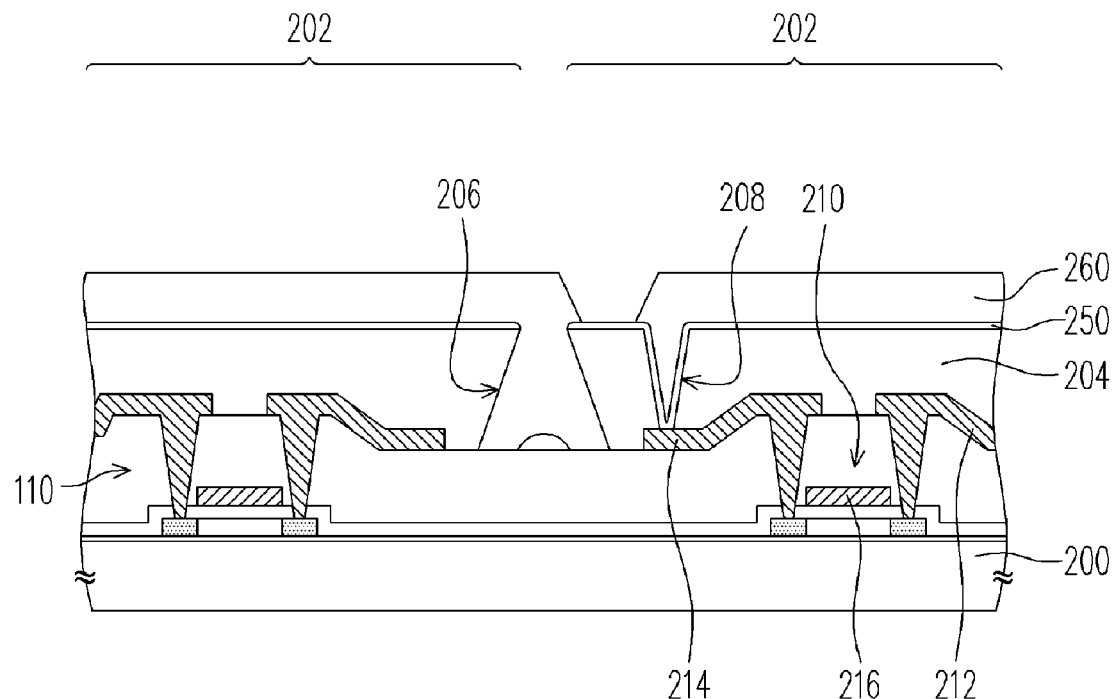
FIG. 5A-5B partially show cross-sectional views of the processing flow for fabricating an organic electroluminescence display of a preferred embodiment of the present invention.

The present invention can be applied to an LCD or an OELD. Taking the LCD as an example, after a color filter (not shown) and the preceding thin film transistor substrate are formed, respectively, these two substrates are assembled and a liquid crystal layer is disposed therebetween. During the process for fabricating the organic electroluminescence display, after the structure as shown in FIG. 2C in the preceding embodiment has been completed, a pixel isolating layer 260 is formed on the substrate 200 and then partially exposes the pixel electrode 250 in each pixel area 202 as shown in FIG. 5A.

Figure 5B:
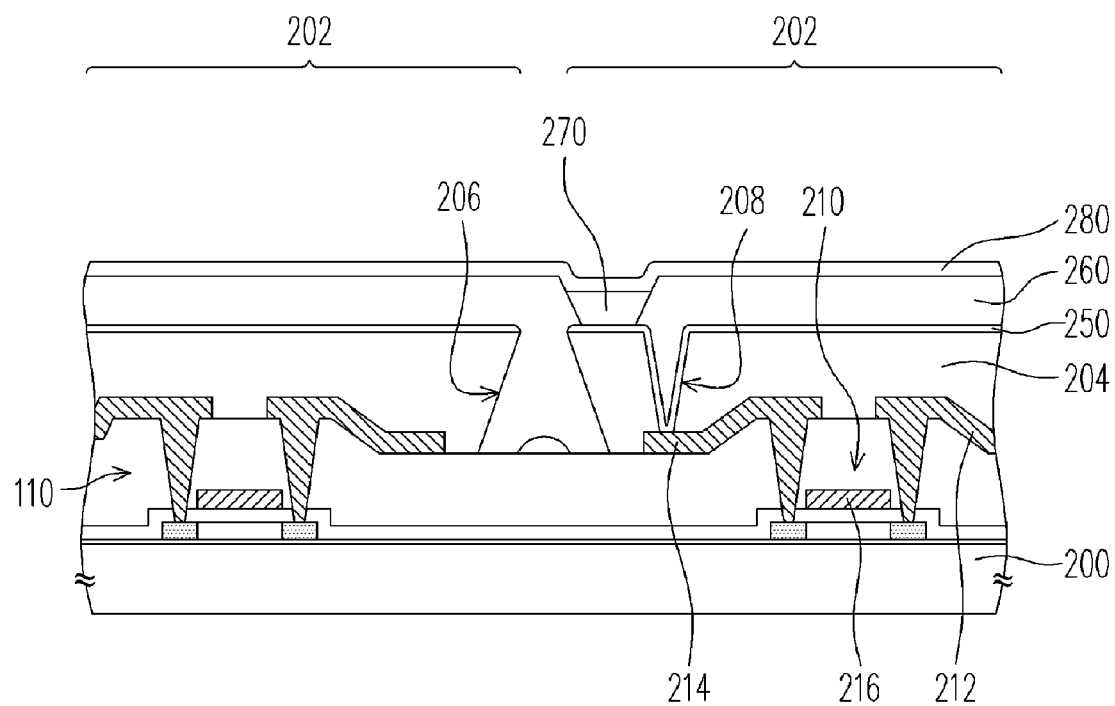

Subsequently, as shown in FIG. 5B, an organic electroluminescence layer 270 is formed on the pixel electrode 250, followed by grossly forming a cathode layer 280 on the substrate 200 so as to mostly accomplish the fabrication of the OELD. Wherein, the method for forming the organic electroluminescence layer 270 on the pixel electrode 250 comprises spraying, etc. One of ordinary skill in the art should know the details of the spraying method, which is accordingly omitted here.

In summary, the present invention utilizes a mask with a semitransparent area to proceed to expose during a photolithography process for forming conventional contact holes, so as to form the recesses with under-cut profiles and contact holes at the same time. As such, when the second film is formed on the first film with the openings, the second film automatically segregates at the recesses so as to form a plurality patterns on the first film. In other words, compared with prior art, the present invention is capable of saving a mask for patterning the second film, which in turn saves fabricating time and cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for patterning films, comprising:
   providing a substrate on which a first film is formed;
   forming a plurality of recesses and openings in the first film at the same time, each recess comprising an under-cut profile and completely passes through the whole first film, wherein the method for forming the openings and recesses comprises:
   forming a photoresist layer on the first film;
   providing a mask, which comprises an opaque area, a transparent area and a semitransparent area;
   patterning the photoresist layer through a photolithography process with the mask and then partially exposing the first film where is predetermined to form the recesses;
   partially removing the photoresist layer and the first film that correspond to the semitransparent area, as well as the first film so as to form the recesses and the openings;
   removing the photoresist layer; and
   forming a second film on the first film, wherein the second film fills the openings and the second film on the first film is separated from the second film formed at the recesses so as to form a plurality of patterns on the first film.

2. The method for patterning films of claim 1, wherein the partial first film where is predetermined to form the recesses, and partial photoresist layer that corresponds to the semitransparent area are removed by using a same etching process.

3. The method for patterning films of claim 1, wherein the partial photoresist layer that corresponds to the semitransparent area is removed by using an ashing method.

4. The method for patterning films of claim 1, wherein the method for removing the partial first film to form the recesses comprises a wet etching or a dry etching.

5. A method for fabricating a thin film transistor array substrate, comprising:
   providing a substrate on which a protection layer and a plurality of thin film transistors are formed, wherein the protection layer covers the thin film transistors, each of which comprises a source-metal layer and a drain-metal layer;
   forming a plurality of recesses and contact holes in the protection layer at the same time, wherein each recess comprises an under-cut profile, completely passes through the whole protection layer and is disposed between neighbor pixel areas, as well as each contact hole exposes the drain-metal layer of its corresponding thin film transistor; and
   forming a transparent conductive layer on the protection layer, wherein the transparent conductive layer fills the contact holes so as to be electrically connected to the drain-metal layer, and the transparent conductive layer on the protection layer is separated from the transparent conductive layer formed at the recesses so as to form a plurality of pixel electrodes.

6. The method for fabricating a thin film transistor array substrate of claim 5, wherein the method for forming the openings and recesses comprising:
   forming a photoresist layer on the protection layer;
   providing a mask, which comprises an opaque area, a transparent area and a semitransparent area;
   patterning the photoresist layer through a photolithography process with the mask and then partially exposing the protection layer where is predetermined to form the recesses; the semitransparent area of the mask is corresponding to area of the contact holes;
   partially removing the photoresist layer and the protection layer that correspond to the semitransparent area, as well as the protection layer so as to form the recesses and the openings; and
   removing the photoresist layer.

7. The method for fabricating a thin film transistor array substrate of claim 6, wherein the partial protection layer where is predetermined to form the recesses, and the partial photoresist layer that corresponds to the semitransparent area are removed by using a same etching process.

8. The method for fabricating a thin film transistor array substrate of claim 6, wherein the partial photoresist layer that corresponds to the semitransparent area is removed by using an ashing method.

9. The method for fabricating a thin film transistor array substrate of claim 6, wherein the method for removing the partial protection layer to form the recesses comprises a wet etching or a dry etching.

10. A method for fabricating an organic electroluminescence display, comprising:
    providing a substrate on which a protection layer and a plurality of thin film transistors are formed, wherein the protection layer covers the thin film transistors, each of which comprises a source-metal layer and a drain-metal layer;
    forming a plurality of recesses and contact holes in the protection layer at the same time, wherein each recess comprises an under-cut profile, completely passes through the whole protection layer and is disposed between neighbor pixel areas, as well as each contact hole exposes the drain-metal layer of its corresponding thin film transistor;
    forming a transparent conductive layer on the protection layer, wherein the transparent conductive layer fills the contact holes so as to be electrically connected to the drain-metal layer, and the transparent conductive layer on the protection layer is separated from the transparent conductive layer formed at the recesses so as to form a plurality of pixel electrodes;
    forming a pixel isolating layer on the substrate, wherein the pixel isolating layer partially exposes each pixel electrode;
    forming an organic electroluminescence layer on the exposed pixel electrode; and
    forming a cathode layer grossly on the substrate to cover the organic electroluminescence layer.

11. The method for fabricating an organic electroluminescence display of claim 10, wherein the method for forming the openings and recesses comprising:
    forming a photoresist layer on the protection layer;
    providing a mask, which comprises an opaque area, a transparent area and a semitransparent area;
    patterning the photoresist layer through a photolithography process with the mask and then partially exposing the protection layer where is predetermined to form the recesses;
    partially removing the photoresist layer and the protection layer that correspond to the semitransparent area, as well as the protection layer so as to form the recesses and the openings; and
    removing the photoresist layer.

12. The method for fabricating an organic electroluminescence display of claim 11, wherein the partial protection layer where is predetermined to form the recesses and the partial photoresist layer that corresponds to the semitransparent area, are removed by using a same etching process.

13. The method for fabricating an organic electroluminescence display of claim 11, wherein the partial photoresist layer that corresponds to the semitransparent area is removed by using an ashing method.

14. The method for fabricating an organic electroluminescence display of claim 11, wherein the method for removing the partial protection layer to form the recesses comprises a wet etching or a dry etching.

* * * * *